US008604445B2

(12) United States Patent
Yamazaki (10) Patent No.: US 8,604,445 B2
(45) Date of Patent: Dec. 10, 2013

(54) METHOD OF EVACUATING SAMPLE HOLDER, PUMPING SYSTEM, AND ELECTRON MICROSCOPE

(75) Inventor: Kazuya Yamazaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 211 days.

(21) Appl. No.: 13/338,503

(22) Filed: Dec. 28, 2011

(65) Prior Publication Data

US 2013/0168549 A1 Jul. 4, 2013

(51) Int. Cl.
*H01J 37/20* (2006.01)
(52) U.S. Cl.
USPC ............. 250/440.11; 250/441.11; 250/442.11
(58) Field of Classification Search
USPC ........ 250/288, 289, 281, 282, 442.11, 440.11
See application file for complete search history.

(56) References Cited

U.S. PATENT DOCUMENTS

| | | | | |
|---|---|---|---|---|
| 4,405,865 A * | 9/1983 | Genty et al. | ............. | 250/442.11 |
| 5,001,350 A * | 3/1991 | Ohi et al. | ................. | 250/440.11 |
| 5,036,205 A * | 7/1991 | Clement et al. | .......... | 250/442.11 |
| 5,075,555 A * | 12/1991 | Woldseth et al. | ........ | 250/370.15 |
| 5,412,503 A * | 5/1995 | Nederlof | ....................... | 359/393 |
| 5,581,088 A * | 12/1996 | Kasai | ......................... | 250/440.11 |
| 7,566,884 B2 * | 7/2009 | Deguchi et al. | .......... | 250/442.11 |
| 8,101,924 B2 * | 1/2012 | Hamochi | ................. | 250/442.11 |
| 8,148,700 B2 * | 4/2012 | Miyazaki | ................. | 250/442.11 |
| 2010/0006771 A1 * | 1/2010 | Miyazaki | ................. | 250/442.11 |
| 2010/0019140 A1 * | 1/2010 | Amirav et al. | ............... | 250/282 |
| 2010/0133448 A1 * | 6/2010 | Hamochi | ................... | 250/491.1 |
| 2011/0017247 A1 * | 1/2011 | Vane et al. | ..................... | 134/198 |
| 2011/0253905 A1 * | 10/2011 | Moebus et al. | .......... | 250/441.11 |
| 2012/0025103 A1 * | 2/2012 | Deshmukh et al. | ........ | 250/491.1 |
| 2012/0293791 A1 * | 11/2012 | Milas et al. | ..................... | 356/72 |
| 2013/0014528 A1 * | 1/2013 | Stabacinskiene et al. | ...... | 62/129 |
| 2013/0119267 A1 * | 5/2013 | Deshmukh et al. | ...... | 250/442.11 |

FOREIGN PATENT DOCUMENTS

| JP | 2009117196 A | 5/2009 |
|---|---|---|
| JP | 201061990 A | 3/2010 |

* cited by examiner

*Primary Examiner* — Jack Berman
*Assistant Examiner* — Johnnie L Smith
(74) *Attorney, Agent, or Firm* — The Webb Law Firm (57) ABSTRACT

Method and system are offered which evacuate a sample holder such that a sample can be inserted into the electron optical column of a microscope while certainly preventing exposure to the atmosphere. The system has pumping control means for controlling a vacuum pumping sequence. The inside of a microscope goniometer is evacuated to a given low vacuum state while the pressure inside a hermetic sample chamber is kept constant by the pumping control means. Then, the partition valve of the sample chamber is opened by the pumping control means and the sample chamber is brought to the low vacuum state. Then, the goniometer and sample chamber are brought to a high vacuum state by the pumping control means. Then, the sample is brought into the front end of the goniometer, and the sample holder is inserted into the electron optical column.

8 Claims, 8 Drawing Sheets

↓ PUMPING

FIG.6E

NITROGEN GAS

↓ PUMPING

METHOD OF EVACUATING SAMPLE HOLDER, PUMPING SYSTEM, AND ELECTRON MICROSCOPE

BACKGROUND OF THE INVENTION

1. Field of the Invention

The present invention relates to a method and system for evacuating a sample holder and, more particularly, to a method and system for evacuating a sample holder in such a way that a hermetic chamber can be connected to the inside of a goniometer under an evacuated state without replacing the insides of the goniometer and of the sample holder by an inert gas and that a sample can be inserted into the electron optical column of a microscope while reliably preventing exposure to the atmosphere.

2. Description of Related Art

A sample held on a sample holder is inserted into position within an electron microscope and irradiated with an electron beam. Then, charged particles and X-rays emanating from the sample are detected. Thus, the shape or composition of the sample can be estimated. In this situation, in a case where materials mainly containing a material such as a battery material that should be kept out of the atmosphere are analyzed, it is necessary that the sample holder be reliably inserted into the electron optical column of a microscope. Especially, in a case of a battery material that should be prevented from being exposed to the atmosphere, it is necessary to insert the sample into the electron optical column of the electron microscope in such a way that the sample is not exposed to the atmosphere.

FIGS. 6A-6H show a conventional sequence of steps for mounting a sample holder to a goniometer.

Figure 6A:
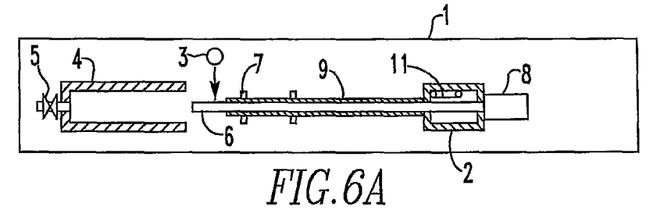
FIGS. 6A-6H are schematic cross sections illustrating a sequence of steps for mounting a conventional sample holder to a goniometer.

Referring to FIG. 6A, there are shown a glove box 1, a hermetic sample chamber 2 disposed in the box 1, a sample 3 placed at the front end of a rod 9, leaf springs 6 having front-end portions gripping the sample therebetween, a seal cap 4, a leak valve 5 mounted at one end of the seal cap 4, a knob 8, and seals 7. The rod 9 has a front-end portion on which the sample 3 is held. The sample 3 and the leaf springs 6 together form a sample holding portion. The sample holding portion and the rod 9 together form a sample holder. The inside of the glove box 1 is maintained in a vacuum or filled with an inert gas.

The rod 9 is used to transport the whole sample holding portion. The sample holder portion is transported into the hermetic chamber by manipulating the knob 8 attached to the rod 9. The sample is kept isolated and shut off from the outside atmosphere by sealing off the hermetic sample chamber 2 with a partition valve 11. The seal cap 4 seals the front end of the sample holder to thereby isolate the sample holding portion from the atmosphere if it is located at the front end of the holder. The seal cap 4 has the leak valve 5 mounted thereon and can place the inside of the cap 4 into communication with the outside atmosphere according to the need. When the microscope sample 3 is placed on the sample holding portion, the sample 3 is held by being sandwiched between the ancillary leaf springs 6.

The microscope sample 3 is held in the sample holding portion by the leaf springs 6 and thus placed in position within the glove box 1.

Figure 6B:
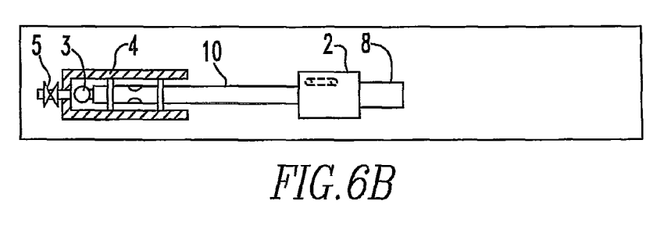

Referring to FIG. 6B, the seal cap 4 is attached at the front end of the holder, and the leak valve 5 of the cap 4 is closed. Under this condition, the partition valve 11 of the hermetic sample chamber 2 is kept open.

Figure 6C:
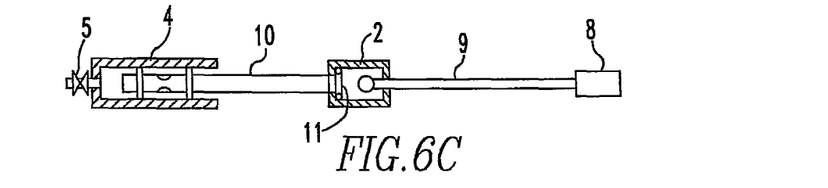

Referring to FIG. 6C, the sample holder is taken into the atmosphere out of the glove box 1 together with the whole seal cap 4. Then, the front-end portion of the sample is moved into the hermetic holder/sample chamber 2 with the knob 8. Subsequently, the partition valve 11 is closed to seal off the hermetic sample chamber 2. In particular, the sample 3 can be brought into the hermetic sample chamber 2 by moving a rod 15 holding the sample through the hermetic inside of the rod 9 to the right as viewed in the figure. As a result, the inside of the hermetic sample chamber 2 can hold the sample 3, and can be maintained as a vacuum or filled with an inert gas.

Figure 6D:
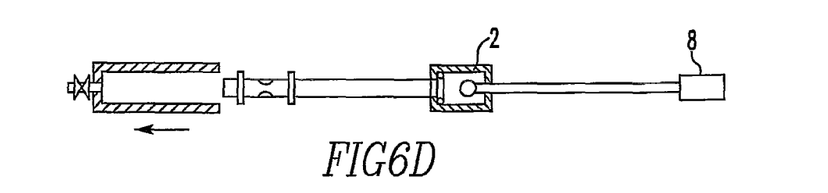

Referring to FIG. 6D, the leak valve 5 of the seal cap 4 is loosened such that the sample holder other than the hermetic sample chamber 2 is vented to the atmosphere. Then, the seal cap 4 is removed. Consequently, only the hermetic sample chamber 2 is held in a vacuum or inert gas ambient.

Figure 6E:
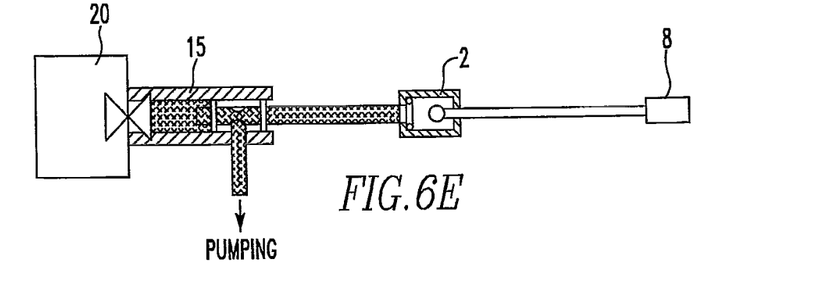

Referring to FIG. 6E, the sample holder is manually set into an electron microscope goniometer 15 and preliminary pumping is done, the goniometer 15 being mounted to the electron optical column 20 as shown.

Figure 6F:
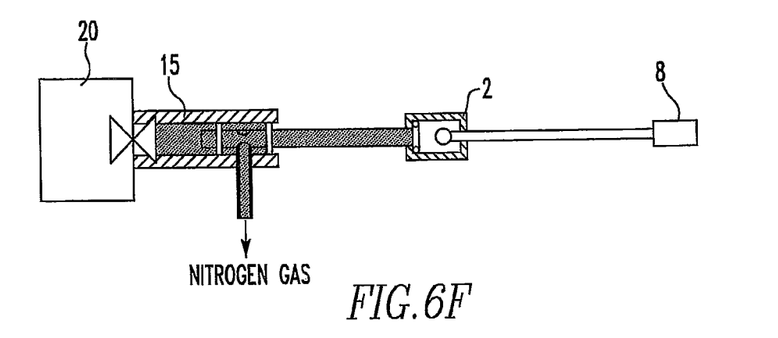

Referring to FIG. 6F, the inside of the goniometer 15 is once vented and filled with nitrogen gas.

Figure 6G:
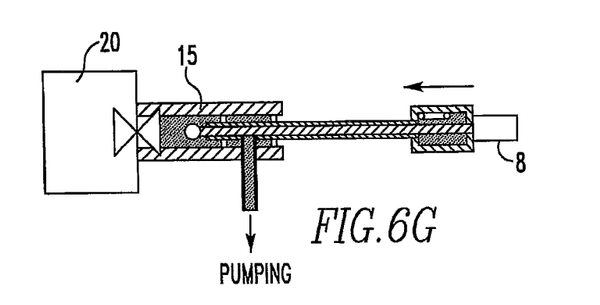

Referring to FIG. 6G, the partition valve 11 is opened and the sample 3 is moved into the front-end portion. Preliminary pumping is again performed, and the sample holder is inserted into the electron optical column 20. In this case, the sample 3 can pass through the goniometer 15.

Figure 6H:
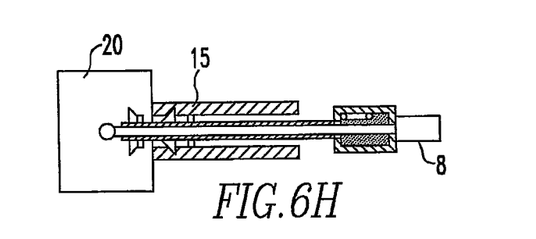

Referring to FIG. 6H, the user performs a microscopic examination using the electron microscope. That is, an electron beam is directed at the sample 3. Secondary electrons, backscattered electrons emitted from the sample 3 or electrons transmitted through the sample 3 are detected.

Figure 7:
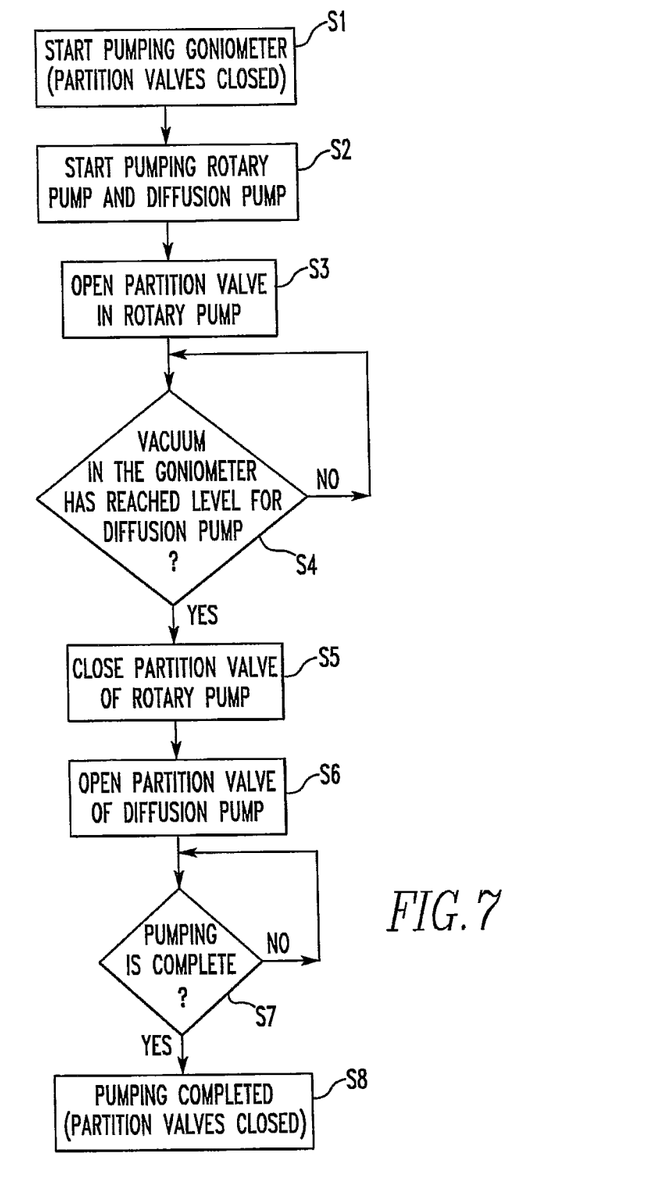
FIG. 7 is a flowchart illustrating a pumping sequence used to evacuate a conventional goniometer.

FIG. 7 is a flowchart illustrating a pumping sequence for a conventional goniometer. This sequence is now described by referring also to FIGS. 6A-6H. First, all the partition valves are closed. Pumping of the goniometer 15 is started (S1). Then, pumping using an oil-sealed rotary pump and an oil diffusion pump is initiated (S2). The partition valve of the oil-sealed rotary pump is opened to start pumping using the rotary pump (S3). Then, a decision is made as to whether the degree of vacuum in the goniometer has reached a level at which pumping using the oil diffusion pump is needed (S4). If the level is not reached, the pumping using the oil-sealed rotary pump is continued.

When the degree of vacuum has reached a level at which pumping using the oil diffusion pump is required owing to the pumping using the oil-sealed rotary pump, the partition valve of the oil-sealed rotary pump is closed (S5). Then, the partition valve of the oil diffusion pump is opened (S6). A decision is made as to whether the degree of vacuum in the goniometer 15 has reached a level at which the pumping is complete (S7). If the pumping is not complete, the pumping using the oil diffusion pump is continued. If the degree of vacuum in the goniometer 15 has reached the level at which the pumping is complete, the pumping of the goniometer 15 is terminated (S8). At this stage, all the partition valves are closed.

One known apparatus of this type is described, for example, in JP-A-2010-61990 (paragraph 0025; FIGS. 4 and 5) and has a sample chamber in which a sample to be irradiated with an electron beam is disposed and gas inlet/exit piping including an inlet pipe for introducing gas into the sample chamber and an exit pipe for discharging gas from the sample chamber. One of the inlet and exit pipes surrounds the outer periphery of the other. The inlet and exit pipes have an increased cross section to increase the conductance for introduction and discharge of the gas.

A technique using a sealing block having a membrane-type gas ambient sample chamber is known and described, for example, in JP-A-2009-117196 (paragraph 0029; FIG. 1). The sealing block is supported by a pair of Y rotary shafts and bearings. The Y rotary shafts are located coaxially on the Y-axis. The sealing block consists of a gas supply tube forming a gas passage, a gas discharge tube, holes accepting the shafts, and a sample holder configured to hold the membrane-type gas ambient sample chamber. The sealing block can be hermetically tilted about the Y-axis.

The prior art techniques have the following problems.

1) Main battery materials to be analyzed are often crystalline. When they are observed with an electron microscope, accurate crystallographic adjustments are required. With the prior art techniques, tilting only about the X-axis is allowed. Therefore, it is impossible to tilt the sample exactly in the desired crystallographic orientation.

2) In the prior art techniques, the material of the front end of the sample holding portion is phosphor bronze that can be a background source when an energy dispersive X-ray analysis is performed. Therefore, undesired X-rays are produced, which is unsuited for energy dispersive X-ray analysis.

3) In the prior art techniques, when the insides of the goniometer and of the front-end portion of the holder are once replaced with an inert gas after the insides are pumped down, it is necessary to manipulate a switch plural times. During this time, there is the danger that an erroneous operation will take place, exposing the sample to the atmospheric gas temporarily.

SUMMARY OF THE INVENTION

In view of the foregoing problems, the present invention has been made. It is an object of the invention to provide method and system for evacuating a sample holder in such a way that a sample can be inserted into the electron optical column of a microscope while certainly preventing exposure to the atmosphere by connecting a hermetic sample chamber and the inside of a goniometer under an evacuated state without previously replacing the inside of the goniometer and the inside of the sample holder by an inert gas.

In order to solve the foregoing problems, the present invention is configured as follows.

(1) A first embodiment of the present invention provides a method of evacuating a sample holder, the method being implemented by a sample holder system for inserting a sample into the electron optical column of a microscope. The method starts with preparing a hermetic sample chamber holding the sample therein and a seal cap connected with the hermetic sample chamber via a rod. The hermetic chamber and the seal cap are mounted in a glove box. Under this condition, the sample holder is taken out of the glove box together with the whole seal cap. The sample is loaded into the hermetic sample chamber. The sample holder system excluding the hermetic sample chamber is brought to atmospheric state. The seal cap is removed from the sample holder. The holder is set to an electron microscope goniometer. Pumping control means for controlling a vacuum pumping sequence is mounted. The inside of the goniometer is evacuated to a given low vacuum state while the pressure inside the hermetic sample chamber is kept constant by the pumping control means. Then, the partition valve of the hermetic sample chamber is opened by the pumping control means to bring the sample chamber to the aforementioned low vacuum state. Subsequently, the goniometer and the hermetic sample chamber are brought to a high vacuum state by the pumping control means. The sample is then moved into the front-end portion of the goniometer. The sample holder is inserted into the electron optical column.

(2) A second embodiment of the invention is based on the first embodiment and further characterized in that a switch is used as the pumping control means. When the switch is ON, pumping of the sample and the sample holder is controlled in such a way that the sample and sample holder are brought to the low vacuum state. Then, the partition valve of the hermetic chamber is opened. After the switch has been turned OFF, pumping is performed such that the sample and sample holder are brought to a high vacuum state.

(3) A third embodiment of the invention is based on the second embodiment and further characterized in that an oil-sealed rotary pump is used to perform pumping until the sample and sample holder are brought to the low pressure state. After the switch has been turned OFF, an oil diffusion pump is used to perform pumping until the sample and sample holder are brought to the high vacuum state.

(4) A fourth embodiment of the present invention provides a pumping system for a sample holder in a sample holder system for inserting a sample into the electron optical column of a microscope. The pumping system has a hermetic sample chamber for holding the sample therein, a seal cap connected with the hermetic sample chamber via a rod, a glove box in which the hermetic sample chamber and the seal cap are disposed, takeout means for taking a sample holder together with the whole seal cap out of the glove box while the hermetic sample chamber and the seal cap are contained in the globe box, and pumping control means for loading the sample into the hermetic sample chamber, bringing the sample holder system excluding the hermetic sample chamber to atmospheric state, removing the seal cap from the holder, setting the holder to an electron microscope goniometer, and controlling a vacuum pumping sequence. The sample holder system further includes first pumping means for evacuating the goniometer until its inside reaches a given low vacuum state while the pressure inside the hermetic sample chamber is kept constant by the pumping control means, second pumping means for opening the partition valve of the hermetic sample chamber by the pumping control means to bring the hermetic sample chamber to the low vacuum state and then bringing the goniometer and the hermetic sample chamber to a high vacuum state by the pumping control means, and insertion means for subsequently moving the sample into a front-end portion of the goniometer and inserting the holder into the electron optical column.

(5) A fifth embodiment of the invention is based on the fourth embodiment and further characterized in that the sample holder has a tilt mechanism capable of tilting along the Y-axis as well as a tilt mechanism capable of tilting along the X-axis.

(6) A sixth embodiment of the invention is based on the fourth or fifth embodiment and further characterized in that the sample holder is made of beryllium.

The present invention yields the following advantageous effects.

(1) According to the first embodiment of the invention, a sample holder-evacuating method can be offered in which the hermetic sample chamber and the inside of the goniometer are connected to each other under an evacuated state without previously replacing the inside of the goniometer and the inside of the sample holder by an inert gas such that the sample can be inserted into the electron optical column of the microscope while certainly preventing exposure to the atmosphere.

(2) According to the second embodiment of the invention, a switch is used as the pumping control means. When the switch is ON, pumping is performed until the sample and specimen holder are brought to a low vacuum state, thereupon the switch is turned OFF. Pumping is performed such that the sample and sample holder are brought to a high vacuum state.

Because of this pumping sequence, gas in the hermetic chamber is prevented from entering the vacuum pump; otherwise the pump would be destroyed.

(3) According to the third embodiment of the invention, an oil-sealed rotary pump is used to perform pumping until the low vacuum state is achieved. An oil diffusion pump is used to perform pumping from the low vacuum state to the high vacuum state. Consequently, the sample ambient can be gradually brought to the high vacuum state.

(4) According to the fourth embodiment of the invention, the sample holder can be inserted into the electron optical column without exposing the hermetic chamber containing the sample therein to the atmosphere.

(5) According to the fifth embodiment of the invention, the tilt mechanism capable of tilting along the Y-axis is mounted in addition to the tilt mechanism capable of tilting along the X-axis. This enables the crystallographic orientation of a crystalline sample to be aligned.

(6) According to the sixth embodiment of the invention, the sample holder is made of beryllium. Therefore, if X-rays hit the sample holder, it is unlikely that X-rays are produced from it. Hence, an accurate energy dispersive X-ray analysis can be performed.

Other objects and features of the invention will appear in the course of the description thereof, which follows.

DESCRIPTION OF THE PREFERRED EMBODIMENTS

The preferred embodiments of the present invention are hereinafter described in detail by referring to the drawings. FIGS. 1A-1H illustrate a sequence of steps according to the present invention for mounting a sample holder to a goniometer. In FIGS. 1A-1H and 6A-6H, like components are indicated by like reference numerals. The sequence of operations illustrated by FIGS. 1A-1H forms a method of the present invention. Hardware configuration for implementing the inventive method constitutes a system according to the present invention.

Figure 1A:
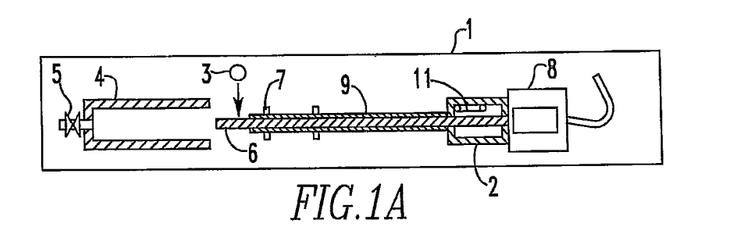
FIGS. 1A-1H are schematic cross sections illustrating a sequence of steps according to the present invention for mounting a sample holder to a goniometer.

Referring to FIG. 1A, a hermetic sample chamber 2 is disposed inside a glove box 1. A rod 9 has a front-end portion on which a sample 3 is placed. Leaf springs 6 have front-end portions between which the sample is held. A leak valve 5 is mounted at one end of a seal cap 4. Indicated by numeral 8 is a knob. The rod 9 has a front-end portion on which the sample 3 is held. Seals 7 act to hold the inside of the seal cap 4 at a given vacuum pressure. The sample 3 and leaf springs 6 together form a sample holding portion. The sample holding portion and the rod 9 together form a sample holder. The inside of the glove box 1 is maintained in a vacuum or filled with an inert gas.

The rod 9 is used to shift the whole sample holding portion. When the rod 9 is moved by manipulating the ancillary knob 8, the sample holding portion is moved in the horizontal direction. The sample 3 is maintained isolated from the outside atmosphere by sealing off the hermetic sample chamber 2 by a partition valve 11, which in turn isolates the sample chamber 2 from the outside atmosphere. The seal cap 4 seals the front end of the sample holder. Consequently, the sample holding portion is isolated from the outside atmosphere even if the sample holding portion is located at the front end of the holder. The leak valve 5 is mounted to the seal cap 4. The inside of the seal cap 4 can be placed in communication with the outside atmosphere according to the need. The microscope sample 3 is placed on the sample holding portion. The sample 3 is held stationary by sandwiching the sample 3 between the ancillary leaf springs 6.

The microscope sample 3 is held between the leaf springs 6, whereby the sample 3 is held to the sample holding portion within the glove box 1. In the present invention, a goniometer capable of tilting in the Y-axis direction as well as in the X-axis direction is used.

Figure 1B:
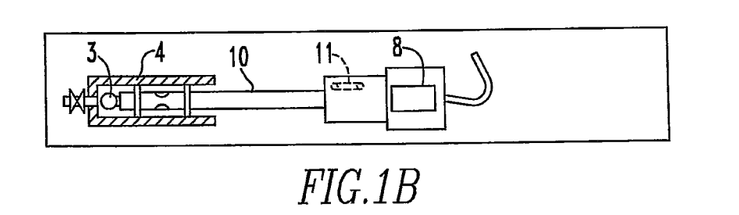

Referring to FIG. 1B, the seal cap 4 is attached at the front end of the holder and the leak valve 5 of the cap 4 is closed. Under this condition, the partition valve 11 of the hermetic sample chamber 2 remains open.

Figure 1C:
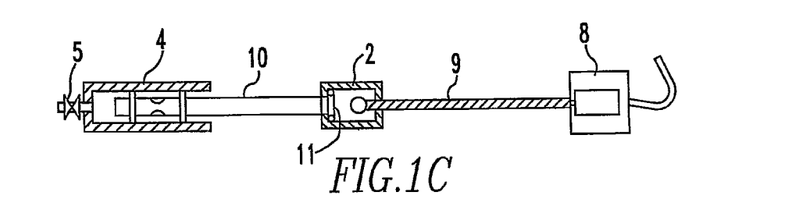

Referring to FIG. 1C, the whole seal cap 4 and the specimen holder are taken into the atmosphere out of the glove box 1. The front end of the sample is moved into the holder/hermetic sample chamber 2 using the knob 8, the partition valve 11 is closed, and the hermetic sample chamber 2 is closed. More specifically, the sample 3 can be carried into the hermetic sample chamber 2 by moving the rod 15 holding the sample to the right as viewed in the figure through the inside of the rod 9 that is kept hermetic. As a result, the inside of the hermetic sample chamber 2 can hold the sample 3. Furthermore, the inside can be maintained in a vacuum or filled with an inert gas.

Figure 1D:
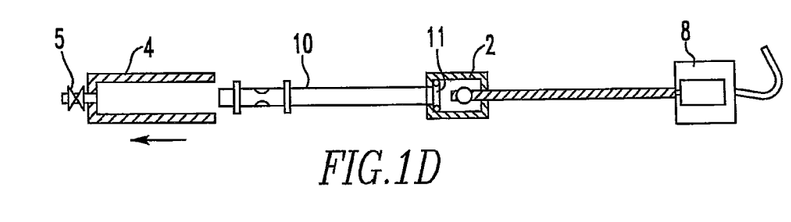

Referring to FIG. 1D, the leak valve 5 of the seal cap 4 is loosened such that the sample holder system other than the sample chamber 2 is vented to the atmosphere. Then, the cap 4 is removed. As a result, only the hermetic sample chamber 2 is maintained in a vacuum or within an ambient of inert gas.

Figure 1E:
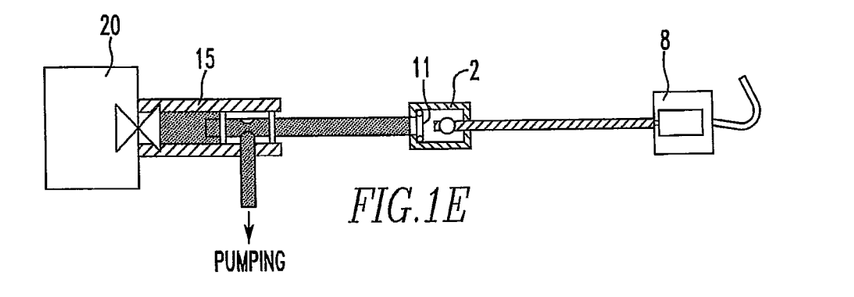

Referring to FIG. 1E, the sample holder is manually set into the goniometer 15 of the electron microscope and preliminary pumping is performed. The goniometer 15 is mounted to the electron optical column 20 as shown.

Figure 1F:
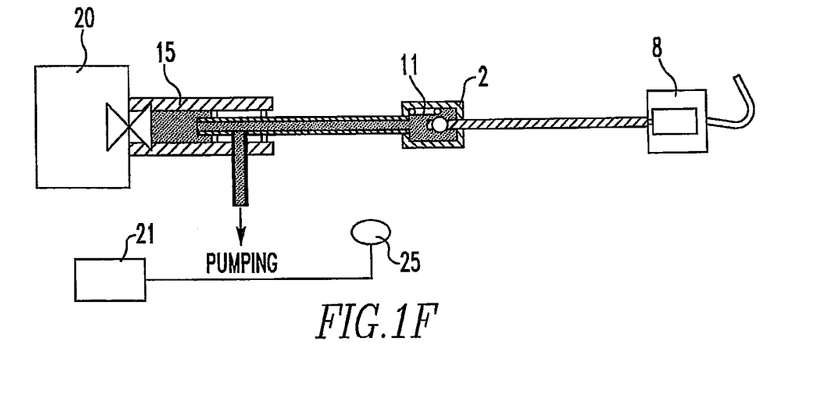

Referring to FIG. 1F, a switch 25 is mounted to pumping control means 21 for controlling the vacuum pumping sequence. When the switch 25 is ON, the pumping control means 21 controls the pumping until the inside of the goniometer 15 reaches a given low vacuum. When the switch 25 is OFF, the pumping is controlled such that the inside of the goniometer 15 reaches a given high vacuum. That is, when the switch 25 is ON, the pumping control means 21 opens the adjusting valve of an oil-sealed rotary pump (not shown) and continues the pumping until the inside of the goniometer 15 reaches the given low vacuum. At this time, the partition valve 11 of the hermetic chamber 2 is open. As a result, the goniometer 15 and the inside of the hermetic sample chamber 2 are pumped down to the same low vacuum.

Figure 1G:
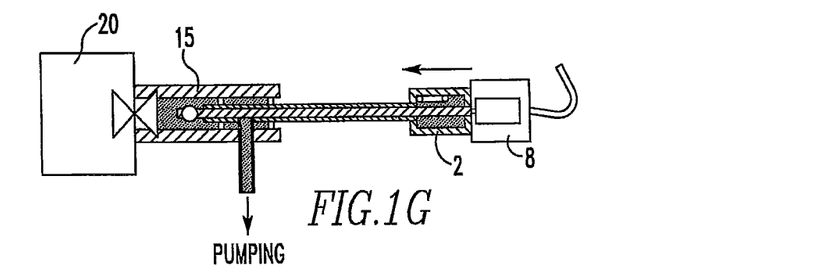

Referring to FIG. 1G, the sample 3 is carried into the front-end portion through the partition valve 11. Then, the switch 25 is turned OFF. The pumping control means 21 opens the adjusting valve of the oil diffusion pump (not shown) such that the inside of the goniometer 15 and the inside of the hermetic sample chamber 2 reach a given high vacuum. In this way, according to the present invention, pumping is performed from the instant when the inside of the hermetic sample chamber 2 reaches the given low vacuum to the instant when the inside of the sample chamber 2 and the inside of the goniometer 15 reach the high vacuum. Therefore, the gas is vented into the vacuum from the sample chamber 2, thus preventing damage to the vacuum pump (not shown). In this case, the sample 3 can pass through the goniometer 15.

Figure 1H:
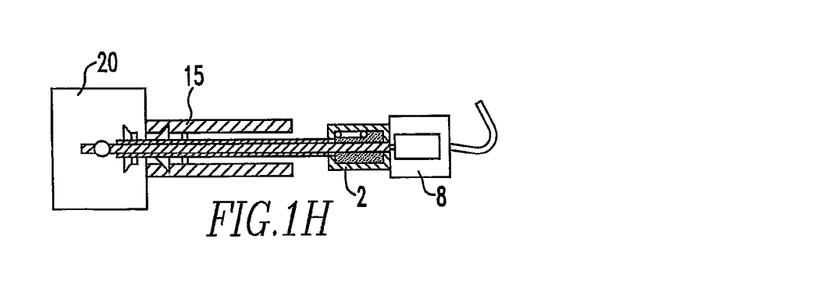

Referring to FIG. 1H, the user inserts the sample holder into the electron optical column 20. A microscopic examination is performed using the electron microscope. That is, the electron beam is made to hit the sample 3. Secondary electrons or backscattered electrons emitted from the sample 3 are detected. Alternatively, electrons transmitted through the sample 3 are detected. In this case, according to the need, if the sample 3 can be tilted in two dimensions, i.e., in the X- and Y-axis directions, with the goniometer 15, the sample 3 can be tilted in any required direction and used. This permits the crystallographic orientation of the sample to be aligned to any desired direction with favorable results.

Figure 2A:
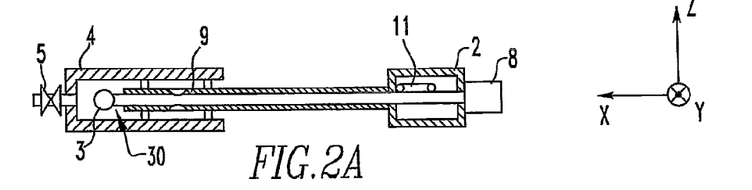
FIGS. 2A and 2B show cross sections of a conventional instrument.
Figure 2B:
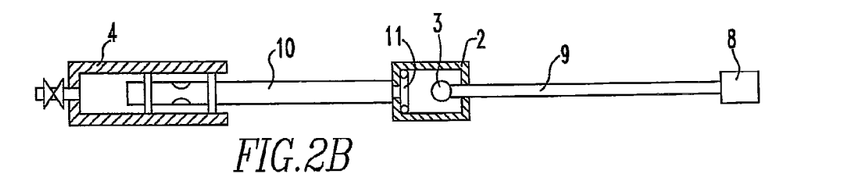

FIGS. 2A and 2B show a conventional instrument, particularly showing the structure of a slide cover holder. In FIGS. 2A, 2B, and 6A-6H, like components are indicated by like reference numerals. There are shown a hermetic sample chamber 2, a sample 3, a seal cap 4, a knob 8, a rod 9, a partition valve 11 mounted inside the sample chamber 2, and a sample holding portion (sample holder) 30.

Figure 3A:
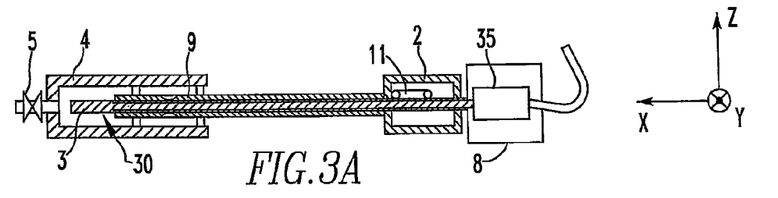
FIGS. 3A and 3B show cross sections of an instrument according to the present invention.
Figure 3B:
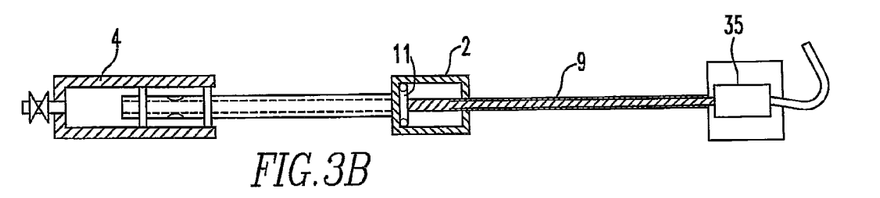

FIGS. 3A and 3B show the structure of an instrument according to the present invention, particularly showing the structure of a sample transfer holder made of beryllium capable of tilting about two axes. In FIGS. 1A-1H, 2A, 2B, 3A, and 3B, like components are indicated by like reference numerals. In the present invention, the sample holder 30 is made of beryllium. Therefore, if an electron beam hits the sample holder 30 made of beryllium, no X-rays will not be produced from it.

In FIGS. 3A and 3B, there are shown a hermetic sample chamber 2, a sample 3, a seal cap 4, a knob 8, a rod 9, a partition valve 11 mounted in the sample chamber 2, a sample holding portion (sample holder) 30, and a two-axis tiltable mechanism 35 capable of tilting in the Y-axis direction. This structure is different from the conventional structure shown in FIGS. 2A and 2B in that the two-axis tiltable mechanism is provided.

Figure 4:
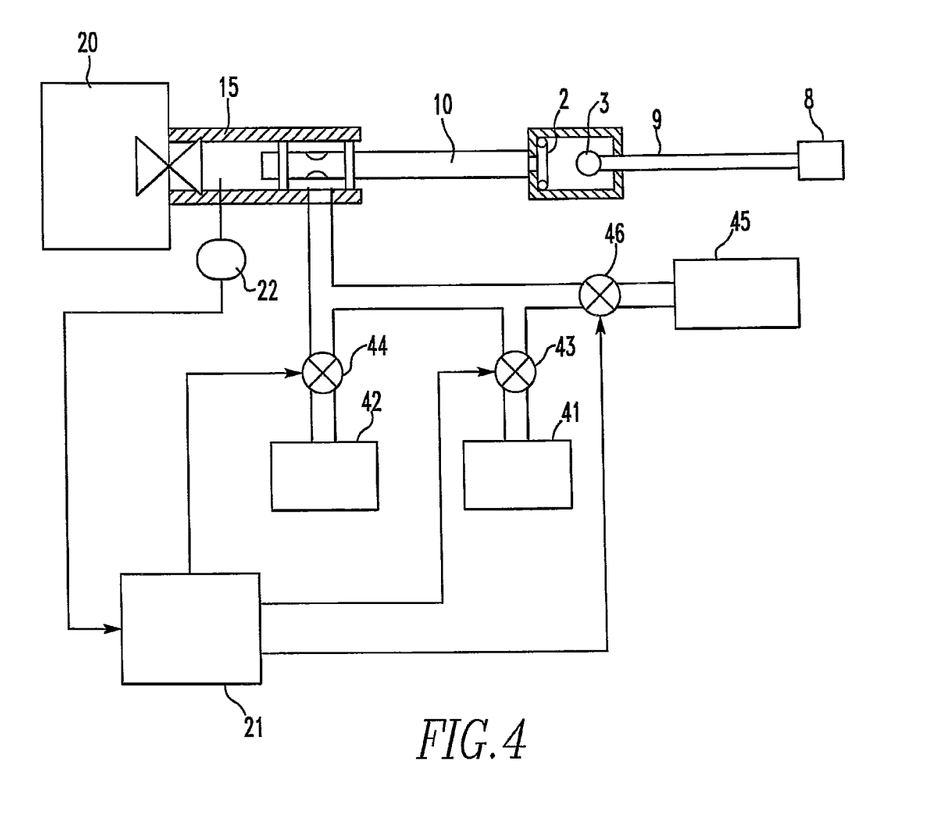
FIG. 4 is a schematic block diagram of a system including the instrument shown in FIGS. 3A and 3B.

FIG. 4 is a schematic block diagram of a system including the instrument shown in FIGS. 3A and 3B. In FIGS. 1A-1H and 4, like components are indicated by like reference numerals. In FIG. 4, there are shown an electron optical column 20, a goniometer 15 mounted in the column 20, a hermetic sample chamber 2, a sample 3, a knob 8, a rod 9, an oil-sealed rotary pump 41 for low vacuum, and an oil diffusion pump 42 for high vacuum. An adjusting valve (partition valve) 43 is mounted in the rotary pump 41. Another adjusting valve (partition valve) 44 is mounted in the oil diffusion pump 42. The oil-sealed rotary pump 41 and the adjusting valve 43 together form first pumping means. The oil diffusion pump 42 and the adjusting valve 44 together form second pumping means. The adjusting valves 43 and 44 are controlled by the pumping control means 21. The degree of vacuum inside the goniometer 15 is measured by a vacuum gauge (vacuum degree measuring means) 22. Information indicating the result of the measurement is sent to the pumping control means 21. A vacuum pumping sequence according to the invention is performed by the system constructed in this way. The sequence is described below.

Figure 5:
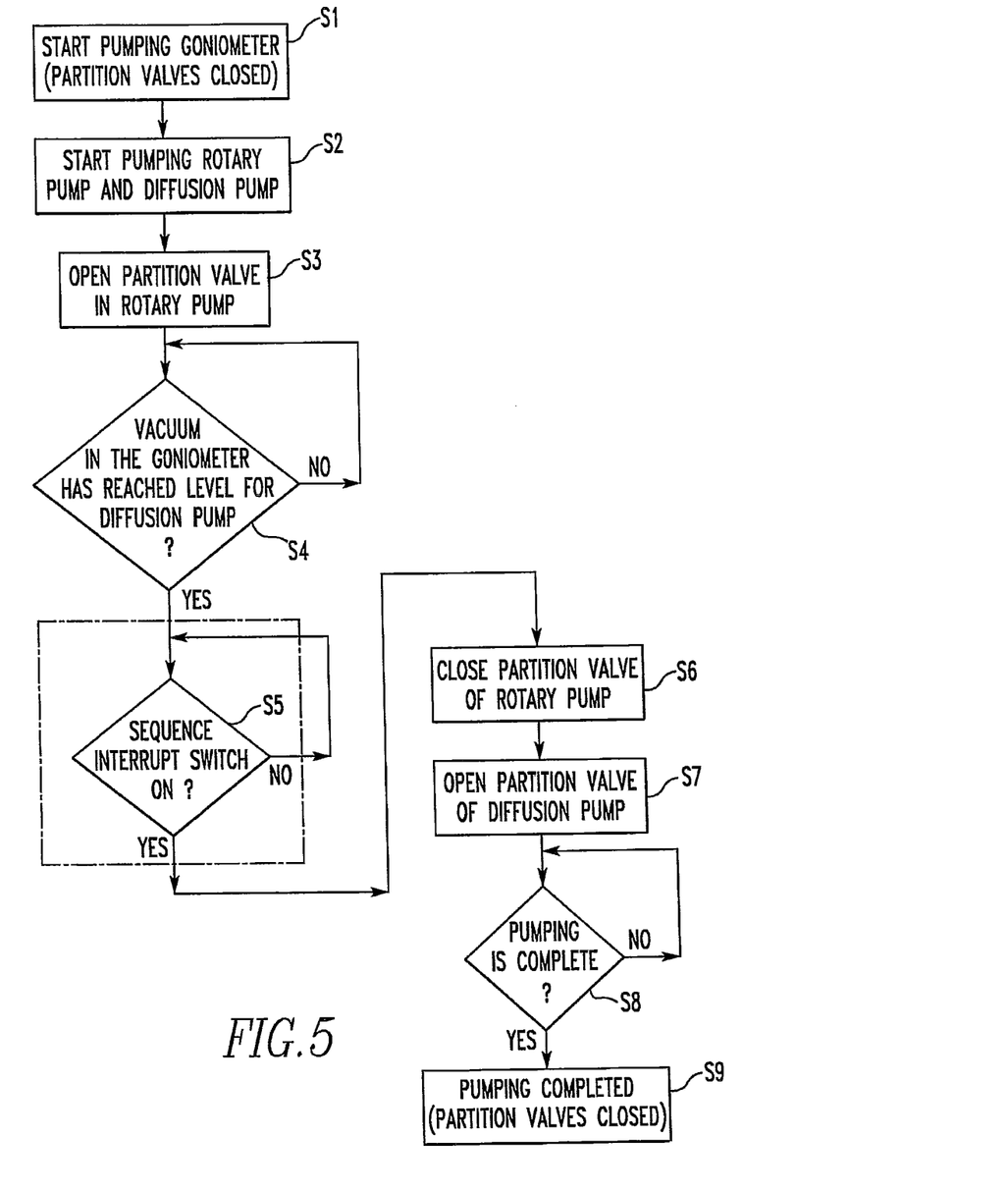
FIG. 5 is a flowchart illustrating a pumping sequence according to the invention used to evacuate a goniometer.

FIG. 5 is a flowchart illustrating the goniometer pumping sequence of the present invention, the sequence being implemented by the system shown in FIG. 4. First, pumping of the goniometer is started (S1). At this time, all the partition valves are closed. Pumping using the oil-sealed rotary pump 41 and the oil diffusion pump 42 is started (S2). Then, the partition valve 43 in the oil-sealed rotary pump 41 is opened, and pumping using the rotary pump 41 is initiated (S3).

Then, the pumping control means 21 makes a decision as to whether the degree of vacuum in the goniometer has reached a level at which pumping using the oil diffusion pump 42 is needed (S4). When the level is not reached, the pumping control means 21 continues the pumping using the oil rotary pump.

When the degree of vacuum achieved by the pumping using the oil-sealed rotary pump has reached a level at which pumping using the oil diffusion pump is necessary, the pumping control means 21 makes a decision as to whether the sequence interrupt switch 25 (see FIG. 1F) is ON (S5). This step S5 is added by the present invention. If the high-vacuum pumping inhibiting switch 25 has been turned ON by the operator (i.e., pumping of the inside of the goniometer using the oil diffusion pump is forcibly inhibited), the low-pressure pumping using the oil-sealed rotary pump 41 is continued.

If the switch 25 is turned OFF by the operator (i.e., the pumping of the inside of the goniometer using the oil diffusion pump is no longer inhibited), the pumping control means 21 closes the partition valve 43 of the oil-sealed rotary pump 41 (S6) and opens the partition valve 44 of the oil diffusion pump 42 (S7). A decision is made as to whether the degree of vacuum inside the goniometer 15 has reached a level at which the pumping is complete (S8). If the level is not reached, the pumping using the oil diffusion pump 42 is continued. If the degree of vacuum inside the goniometer 15 has reached the level at which the pumping is complete, the pumping of the goniometer 15 is terminated (S9). At this stage, all the partition valves are closed.

As described in detail so far, the present invention yields the following advantageous effects.

1) The crystallographic orientation of a crystalline sample can be desirably aligned by the provision of the mechanism permitting tilt along the Y-axis.

2) Since the sample holding portion is made of beryllium, if energy dispersive X-ray analysis is performed, X-ray induced background emissions from other than the sample are reduced.

3) The hermetic sample chamber and the inside of the goniometer can be coupled together under an evacuated state without previously replacing the inside of the goniometer and the inside of the holder by an inert gas. Therefore, the sample can be inserted into the electron optical column of a microscope while certainly preventing exposure to the atmosphere.

Having thus described my invention with the detail and particularity required by the Patent Laws, what is desired protected by Letters Patent is set forth in the following claims.

The invention claimed is:

1. A method of evacuating a sample holder in a sample holder system permitting a sample to be inserted into an electron optical column of a microscope, said method comprising the steps of:

preparing a hermetic sample chamber holding the sample therein and a seal cap connected with the hermetic sample chamber via a rod;

mounting the hermetic sample chamber and the seal cap in a glove box;

taking the sample holder out of the glove box together with the whole seal cap while the hermetic sample chamber and the seal cap are contained in the glove box;

loading the sample into the hermetic sample chamber;

bringing the sample holder system excluding the hermetic sample chamber to atmospheric state;

removing the seal cap from the sample holder;

setting the holder to an electron microscope goniometer;

mounting pumping control means for controlling a vacuum pumping sequence;

evacuating an inside of the goniometer to a given low vacuum state while a pressure inside the hermetic sample chamber is kept constant by the pumping control means;

then opening a partition valve of the hermetic sample chamber by the pumping control means to bring the sample chamber to said low vacuum state;

then bringing the goniometer and the hermetic sample chamber to a high vacuum state by the pumping control means; and then moving the sample into a front-end portion of the goniometer and inserting the sample holder into the electron optical column.

2. The method of evacuating a sample holder as set forth in claim 1, wherein a switch is used as said pumping control means;

wherein, when the switch is ON, pumping of the sample and the sample holder is so controlled that the sample and the sample holder are brought to the low vacuum state and then the partition valve of the hermetic sample chamber is opened; and wherein, after the switch has been turned OFF, pumping is performed to bring the sample and the sample holder to a high vacuum state.

3. The method of evacuating a sample holder as set forth in claim 2, wherein an oil-sealed rotary pump is used to perform pumping until the sample and the sample holder are brought to the low vacuum state, and wherein, after the switch has been turned OFF, an oil diffusion pump is used to perform pumping until the sample and the sample holder are brought to the high vacuum state.

4. A pumping system for a sample holder in a sample holder system for inserting a sample into an electron optical column of a microscope, said pumping system comprising:

a hermetic sample chamber holding the sample therein;

a seal cap connected with the hermetic sample chamber via a rod;

a glove box in which the hermetic sample chamber and the seal cap are disposed;

takeout means for taking a sample holder together with the whole seal cap out of the glove box while the hermetic sample chamber and the seal cap are contained in the glove box;

pumping control means for loading the sample into the hermetic sample chamber, bringing the sample holder system excluding the hermetic sample chamber to atmospheric state, removing the seal cap from the holder, setting the holder to an electron microscope goniometer, and controlling a vacuum pumping sequence;

first pumping means for evacuating the goniometer until its inside reaches a given low vacuum state while a pressure inside the hermetic sample chamber is kept constant by the pumping control means;

second pumping means for subsequently opening a partition valve of the hermetic sample chamber by the pumping control means to bring the hermetic sample chamber to the low vacuum state and then bringing the goniometer and the hermetic sample chamber to a high vacuum state by the pumping control means; and insertion means for then moving the sample into a front-end portion of the goniometer and inserting the holder into the electron optical column.

5. The pumping system for a sample holder as set forth in claim 4, wherein said sample holder has a mechanism permitting tilt along a Y-axis in addition to a mechanism permitting tilt along an X-axis.

6. The pumping system for a sample holder as set forth in claim 4, wherein said sample holder is made of beryllium.

7. The pumping system for a sample holder as set forth in claim 5, wherein said sample holder is made of beryllium.

8. An electron microscope adapted to shift a sample loaded in a hermetic sample chamber into an electron microscope goniometer via a rod, said electron microscope comprising:

vacuum degree measuring means for measuring a degree of vacuum inside the goniometer;

first pumping means for evacuating an inside of the goniometer;

second pumping means for evacuating the inside of the goniometer;

pumping inhibiting switch for inhibiting the second pumping means from evacuating the inside of the goniometer; and pumping control means for controlling the first and second pumping means such that the inside of the goniometer is evacuated by the second pumping means instead of the first pumping means based on results of a measurement made by the vacuum degree measuring means and on a state of the pumping inhibiting switch.

* * * * *